(12) United States Patent
Le Tiec et al.

(10) Patent No.: US 8,501,588 B2
(45) Date of Patent: Aug. 6, 2013

(54) METHOD FOR MAKING A SEMICONDUCTOR STRUCTURE WITH A BURIED GROUND PLANE

(75) Inventors: Yannick Le Tiec, Crolles (FR); Francois Andrieu, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/057,239

(22) PCT Filed: Aug. 13, 2009

(86) PCT No.: PCT/EP2009/060474
§ 371 (c)(1),
(2), (4) Date: Aug. 12, 2011

(87) PCT Pub. No.: WO2010/018204
PCT Pub. Date: Feb. 18, 2010

(65) Prior Publication Data
US 2011/0284870 A1 Nov. 24, 2011

(30) Foreign Application Priority Data

Aug. 14, 2008 (FR) ...................... 08 55587

(51) Int. Cl.
*H01L 21/30* (2006.01)
*H01L 21/46* (2006.01)
*H01L 21/76* (2006.01)

(52) U.S. Cl.
USPC ............ 438/459; 438/458; 438/455; 438/406

(58) Field of Classification Search
USPC ................... 257/77; 438/459, 458, 406, 455, 438/456, 457, 528, 795, 771, 692, 478, 585, 438/503, 497, 460, 588
See application file for complete search history.

(56) References Cited

U.S. PATENT DOCUMENTS

| | | |
|---|---|---|
| 6,323,108 B1 | 11/2001 | Kub et al. |
| 2006/0019465 A1 | 1/2006 | Guidry Cleavelin |
| 2007/0210307 A1 | 9/2007 | Hebras |
| 2008/0153313 A1 | 6/2008 | Kononchuk |
| 2008/0223285 A1 | 9/2008 | Lee |
| 2009/0321873 A1* | 12/2009 | Nguyen et al. ................ 257/506 |

FOREIGN PATENT DOCUMENTS

| | | |
|---|---|---|
| FR | 2 898 430 | 9/2007 |
| WO | 03 103026 | 12/2003 |

OTHER PUBLICATIONS

Ernst, T., et al., "A Model of Fringing Fields in Short-Channel Planar and Triple-Gate SOI MOSFETs," IEEE Transactions on Electron Devices, vol. 54, No. 6, pp. 1366-1369, (Jun. 2007).
International Search Report issued Oct. 9, 2009 in PCT/EP09/060474 filed Aug. 13, 2009.
French Search Report issued Feb. 23, 2009 in French Patent Application No. 08 55587 filed Aug. 14, 2008.

* cited by examiner

*Primary Examiner* — Chuong A. Luu
(74) *Attorney, Agent, or Firm* — Oblon, Spivak, McClelland, Maier & Neustadt, L.L.P.

(57) ABSTRACT

A method for making a semiconducting structure, including: a) forming, on a surface of a final semiconductor substrate, a semiconducting layer, doped with elements from columns III and V of the Periodic Table so as to form a ground plane, b) forming a dielectric layer, c) then assembling, by direct adhesion of the source substrate, on the final substrate, the layer forming the ground plane between the final substrate and the source substrate, the dielectric layer being between the source substrate and the ground plane, d) then thinning the source substrate, leaving, on the surface of the semiconductor structure, a film made from a semiconducting material.

16 Claims, 3 Drawing Sheets

FIG.2A0

METHOD FOR MAKING A SEMICONDUCTOR STRUCTURE WITH A BURIED GROUND PLANE

TECHNICAL FIELD AND BACKGROUND OF THE INVENTION

The invention relates to making new structures for semiconductor components, and in particular SOI (silicon on insulator), or more generally semiconductor on insulator structures.

As illustrated in FIG. 5A, SOI structures (and more generally semiconductor on insulator structures) are stacks made up of a superficial film 20 made from monocrystalline silicon (semiconducting material, respectively), a dielectric layer 3, in general silicon oxides, and a support substrate 2, e.g. silicon. These SOI structures are for example obtained through assembly by molecular adhesion of a surface oxidized silicon plate, with another silicon plate, then thinning the first substrate.

More precisely, the assembly comprises a step for preparing the surface of the two plates, a contacting step, and a thermal treatment step. Traditionally, this thermal treatment is done at temperatures typically between 900° and 1250° C. for 2 h.

Then, at least one of the two plates is thinned, allowing a thin semiconductor layer 20 to remain on a dielectric layer 3.

The thinning occurs through different mechanical, or chemical, means, or by separation at an embrittled buried layer, for example by implanting gaseous species (e.g. hydrogen).

For certain applications, it is interesting to obtain circuits on a conducting ground plane 4 (FIG. 5B).

To that end, one seeks to have the assembly formed by the superficial semiconducting layer 20 and the buried dielectric layer 3 arranged on an electrically conducting layer, or ground plane (FIG. 5B). In this way, it is possible to control the density of the carriers in the semiconductor layer near the interface via the potential difference applied to the buried conducting layer and the semiconducting layer.

However, it is difficult to obtain SOI plates with a dielectric layer 3 having a small thickness, e.g. less than 150 nm, and a ground plane.

One of the methods used by SOI substrate users is the ion implantation of the final SOI substrate through the film 20 and the electrically insulating layer 3 to dope the semiconducting material of the substrate so as to obtain a conducting layer situated at the interface between the dielectric layer and the final substrate.

Ideally, to have a ground plane, it is necessary to implant the substrate, through the surface film 20 and the insulator layer 3, so as to have doping greater than $10^{19}$ at·cm$^{-3}$, preferably greater than $10^{20}$ at·cm$^{-3}$, for example $10^{21}$ at·cm$^{-3}$. However, obtaining this optimum poses a problem, as the use of fairly significant ion implantation (in the vicinity of $10^{16}$ at·cm$^{-2}$ or $10^{15}$ at·cm$^{-2}$), to obtain such doping under the oxide layer 3, leads to degradation of the layers passed through, i.e. doping and degradation of the superficial semiconductor layer 20 and the electrically insulating layer 3. This has an impact on the performance of the superficial layer, in which components must be made, e.g. transistors (this layer can in particular serve as a channel for transistors). To offset this phenomenon, it is common for the implantation doses to be reduced, to ultimately obtain doping close to $10^{18}$ at·cm$^{-3}$, below the optimal conditions. This under-dosed implantation limits (but does not eliminate) the degradations of the layer 20.

The problem therefore arises of making a SOI semiconducting structure having a ground plane between the dielectric layer and the final substrate, the two upper layers, superficial layer of semiconducting material and dielectric material not being degraded by the formation of said ground plane.

The problem also arises of achieving the optimal doping to form the ground plane.

BRIEF DESCRIPTION OF THE INVENTION

The invention first relates to a method for making a semiconductor on insulator structure, comprising:

a) forming, on the surface of a semiconductor substrate, called the final substrate, a semiconducting layer, doped with elements from columns III and V of the Periodic Table so as to form a ground plane, b) then assembling a semiconducting substrate, called the source substrate, either in a semiconducting material, or including, at least on the surface, a semiconducting film, on or with the final substrate, the ground plane layer being between the final substrate and the source substrate, and at least one dielectric layer being formed on the final substrate, above the ground plane, and/or on the source substrate before the assembly, c) then partially thinning the source substrate, leaving, on the surface of the semiconductor structure, at least part of the semiconductor film present on the surface of the source substrate.

The doping element, serving to form the ground plane layer, is chosen among boron (B), arsenic (As), phosphorus (P), nitrogen (N), antimony (Sb), aluminum (Al), gallium (Ga), indium (In).

In one method according to the invention, before assembly of the source substrate and the final substrate, a ground plane is formed in a semiconducting material doped with elements from columns III or V of the Periodic Table, the doping of said layer preferably being greater than $5 \cdot 10^{18}$ at·cm$^{-3}$, preferably greater than $10^{19}$ at·cm$^{-3}$ and advantageously greater than $10^{20}$ at·cm$^{-3}$, for example $10^{21}$ at·cm$^{-3}$.

Then, at least one electrically insulating layer is formed on one of the two substrates.

Then the two substrates are assembled by molecular adhesion, the ground plane layer and the dielectric layer then being between the two substrates.

Then the source substrate is partially thinned so as to obtain a film made from a semiconducting material above the dielectric layer, the ground plane and the final substrate.

The doping step to form the ground plane, done before the assembly step and formation of the superficial film of semiconducting material (intended to be used, for example, to form all or part of the transistors there) does not risk damaging said superficial film.

The doping in the ground plane can be of the "p" or "n" type and is advantageously greater than $10^{19}$ at·cm$^{-3}$ and potentially greater than $10^{20}$ at·cm$^{-3}$.

The ground plane can be formed through ion implantation of the surface of the final substrate. This ion implantation can be done through a superficial layer, e.g. made from oxide, deposited before implantation and that can be eliminated after implantation.

In one alternative, the ground plane can be formed by deposition through epitaxy or CVD or MBE or using another method for depositing a doped semiconducting layer.

The dielectric layer can be formed by reaction on the surface of the source substrate, e.g. by oxidation or nitriding, or by deposition on the source substrate or the ground plane.

In one alternative, at least one of the faces to be assembled undergoes surface nitriding before assembly, e.g. by plasma treatment.

In one alternative of a method according to the invention, preceding the formation of the ground plane, a layer acting as a barrier against diffusion can be deposited on the final substrate, the barrier layer then being positioned between the final substrate and the ground plane.

The source substrate can have undergone a localized implantation in the depth thereof of gaseous species, preferably hydrogen, to form an embrittled buried layer. In that case, the partial thinning of the source substrate can be done using a substrate fracture method of the "Smart-Cut™" type, described below, possibly followed by polishing.

According to another embodiment of a method according to the invention, the partial thinning of the source substrate can be done by milling and/or chemical, or mechanical or mechano-chemical polishing, and/or chemical etching. In that case, there is no prior implantation in the source substrate.

The invention also relates to a device with superimposed semiconducting layers, including, in order:

a) a substrate called the final substrate, b) a semiconducting layer, doped with elements from columns III and V of the Periodic Table, forming a ground plane, positioned above the substrate, with a dopant concentration greater than $10^{18}$ at·cm$^{-3}$, or greater than $10^{19}$ at·cm$^{-3}$ or even $10^{20}$ at·cm$^{-3}$, c) at least one layer of dielectric material, the ground plane being comprised between the dielectric layer and the final substrate, the dielectric layer being present between the superficial semiconducting film and the ground plane, d) a film made from semiconducting material, above the dielectric layer, the ground plane and the final substrate.

In a method or a device according to the invention, the final substrate can have been covered, before deposition of the ground plane layer, with a layer of a material acting as a barrier against diffusion, e.g. made from silicon carbide or a nitrided semiconducting material. This layer being present, after assembly, between the final substrate and the ground plane.

In a method or device according to the invention, the final substrate and/or the source substrate can be made from silicon, or SiC, or SiGe, or Ge, or GaN . . .

DETAILED DESCRIPTION OF SPECIFIC EMBODIMENTS

Figure 1A:
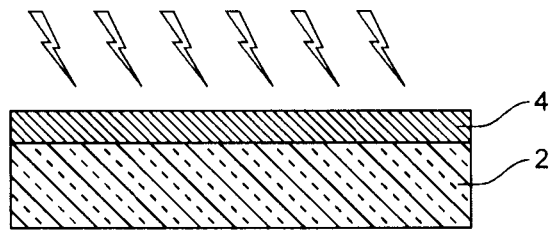
FIGS. 1 and 2 show preferred embodiments of methods according to the invention.

Several embodiments of the invention are detailed below, illustrated by FIGS. 1 to 2, in which the references of the different elements are shared by the various figures.

A first method according to the invention is described with FIGS. 1A to 1E.

Firstly, the surface 12 of a substrate 2 made from a semiconducting material, or a substrate 2 having, at least on the surface, a layer made from a semiconducting material, e.g. silicon or silicon carbide, is subjected to an ion implantation (FIG. 1A) so as to dope the surface volume 4 with elements from columns III or V of the Periodic Table so as to form a ground plane, i.e. to make said doped layer 4 at least partially conducting. The dopants can be introduced into the semiconducting substrate in ways other than by implantation, e.g. plasma doping or CVD doping.

The doping in said layer 4 is greater than $10^{18}$ at·cm$^{-3}$, or than $5 \cdot 10^{18}$ at·cm$^{-3}$, it is preferably greater than $10^{19}$ at·cm$^{-3}$ and advantageously greater than $10^{20}$ at·cm$^{-3}$ and can thus form either an "n"-doped semiconductor, or a "p"-doped semiconductor.

The substrate 2, and therefore the ground plane, is for example silicon-based. Advantageously for a semiconducting layer made from silicon or $Si_{99\%}(C)_{1\%}$, or including at least one superficial layer made from one of said materials, the dopants will be chosen among boron (B), arsenic (As), phosphorus (P), antimony (Sb), gallium (Ga), indium (In). For a semiconducting layer made from SiC, nitrogen (N) or aluminum (Al) are preferred. This doping step does not pass through any layer subsequently needed to be used to form all or part of the electronic components. It therefore cannot damage such a layer.

Doping by implantation can be done through a superficial layer, e.g. an oxide mask. This mask is therefore deposited just before the implantation step and is preferably removed just after said step.

Alternatively, the ground plane 4 can be formed by deposition on the substrate 2, using CVD, or epitaxy, or molecular jet growth, . . . etc. In this case again, there is no impairment of the future thin layer of semiconducting material 20.

Figure 1B:
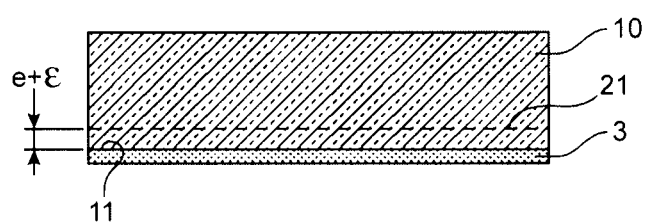

On a second substrate 10, called the source substrate, a dielectric layer 3 may be formed (FIG. 1B). This layer is for example made from oxide (SiO2 for example), and/or nitride (SixNy) and/or a high K material (such as HfO2, Al2O3, HfSiON . . . ). This layer 3 can have been formed by deposition or oxidation or nitriding of the surface of the source substrate 10. This layer 3 can alternatively be deposited above the ground plane layer 4, on the substrate 2.

A localized implantation 21 of gaseous species, at a depth e+∈ under the dielectric layer 3 (or under the surface 11 of the source substrate 10 if there is no dielectric layer or if said layer is made after implantation), can then be done in anticipation of a thinning by substrate fracture. Hereinafter, the "Smart Cut™" method will be mentioned. This method is for example described in the article by B. Aspar and A. J. Auberton-Hervé "Silicon Wafer Bonding Technology for VLSI and MEMS applications", edited by S. S. Iyer and A. J. Auberton-Hervé, 2002, INSPEC, London, Chapter 3, pages 35-52. The implanted species is advantageously hydrogen. Alternatively, it can be helium or a rare gas or a combination of said species.

Alternatively, instead of being formed on the final substrate 2, the ground plane layer 4 can be formed by deposition, according to the techniques described above, on the oxide layer 3, itself formed on the source substrate 10, the layer 3 then being between the source substrate and the ground plane.

Figure 1C:
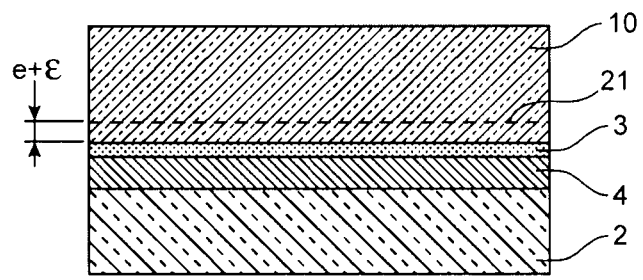

Then, the two substrates 2 and 10 are assembled by molecular adhesion, by the free surfaces (FIG. 1C). These free surfaces are those making it possible to obtain a stack of thin layers comprising a source substrate 10, a dielectric layer 3 in contact with the substrate 10, a conducting layer 4 with a base of a semiconducting material, forming the ground plane, between the insulating layer 3 and the final substrate 2. In the cases of FIGS. 1B and 1C, the free surfaces are those of the ground plane 4 and the dielectric layer 3.

This molecular adhesion can for example be done between hydrophilic surfaces. To that end, the surfaces are then prepared beforehand following the techniques known by those skilled in the art (chemical cleaning, CMP, plasma activation, UV ozone treatment . . . ) before being put in contact.

In one alternative, the dielectric layer being formed on the substrate 10 and the ground plane 4 being formed on the substrate 2, the ground plane 4 can be covered before adhesion of a dielectric layer, made from oxide (SiO2 for example), and/or nitride (SixNy) and/or a high K material (such as HfO2, Al2O3, HfSiON . . . ).

It is also possible, before assembly, to nitride at least one of the two faces to be assembled, e.g. by plasma treatment.

Figure 1D:
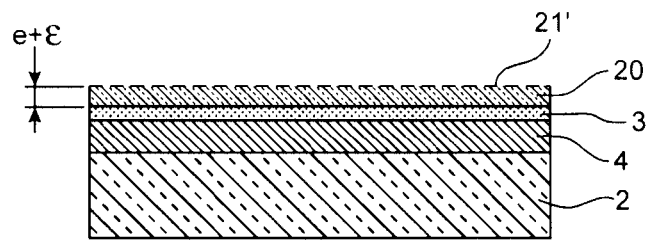
Figure 1E:
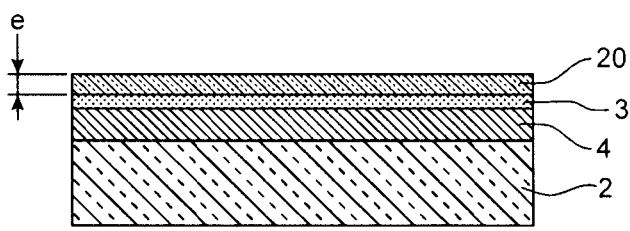

The rear face of the source substrate 10 is then thinned so as only to leave a film 20, with thickness e, made from a semiconducting material (FIG. 1D). This thinning step is done, for example, by fracturing the source substrate 10 at the embrittled zone created beforehand at the depth e+∈, followed by polishing of the surface 21' formed so as to obtain the film 20, with thickness e, on the surface of the SOI semiconducting structure (FIG. 1E).

Alternatively, the partial thinning of the source substrate 10 can be done by milling and/or polishing and/or chemical etching. In this case, there is no prior formation of an embrittlement zone 21 in the donor substrate 10.

A second example of a method according to the invention will be described relative to FIGS. 2A0 and 2A to 2E.

Figure 2A:
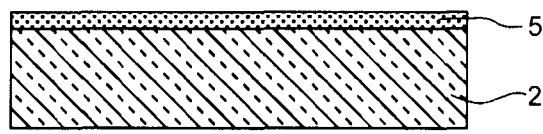
Figure 2A:
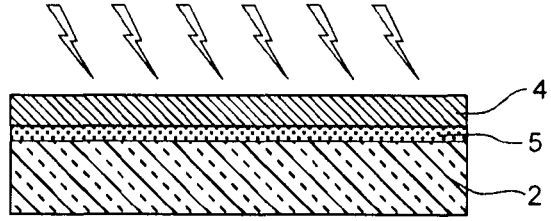
Figure 2B:
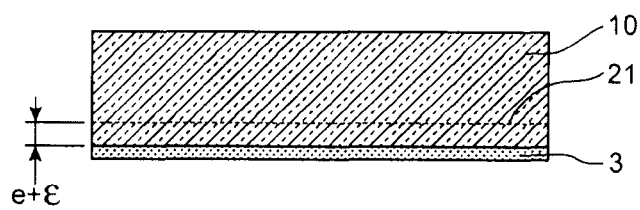
Figure 2C:
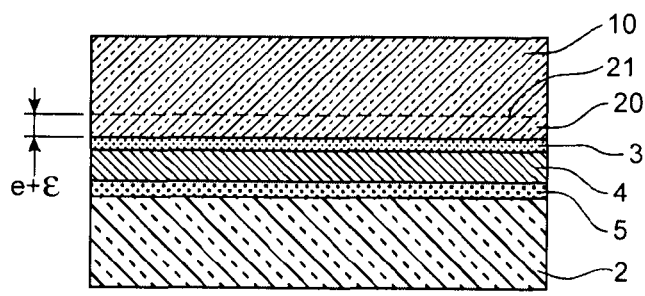
Figure 2D:
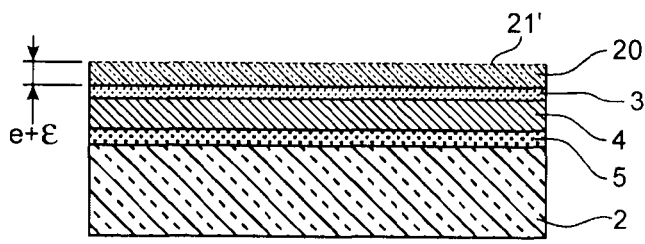
Figure 2E:
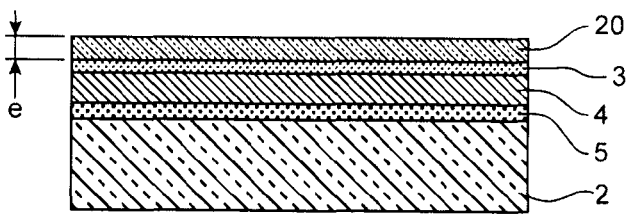

The steps carried out are identical to those described relative to FIGS. 1A to 1E, except for FIG. 2A0, which illustrates a step before the step of FIG. 2A.

Reference will therefore be made to the preceding description, to which the description of FIG. 2A0, below, is added.

A barrier layer 5 is deposited on the substrate 2 before the ground plane 4 is formed on that same substrate (FIG. 2A0). Said layer acts as a barrier against diffusion to limit, and advantageously block, the diffusion of the doping species in the final substrate 2, in order to preserve the quality of the conductivity of the ground plane. This barrier layer is advantageously made from silicon carbide, e.g. $Si_{99\%}(C)_{1\%}$ when it involves limiting the boron diffusion, for example. After assembly, this barrier layer 5 is therefore located between the ground plane 4 and the final substrate 2.

Above this barrier layer, the ground plane layer 4 is formed (FIG. 2A), e.g. by depositing a semiconducting layer followed by doping by implantation of said layer as previously described, or by depositing a semiconducting layer doped using the means described in the first embodiment.

Here again, the partial thinning of the source substrate 10 can be done either by fracture along an embrittlement zone formed in said substrate, as described in the first example, or by milling and/or polishing and/or chemical etching.

The invention covers all combinations of the two embodiments previously described, in particular those resulting from variations concerning the formation of the ground plane, and the thinning method. These alternatives can be combined with those related to the formation or non-formation, before assembly of the substrates, of a dielectric layer on at least one of the surfaces to be assembled and/or the formation of a barrier layer under the ground plane.

The methods described above make it possible to obtain a semiconducting device including:
  a substrate,
  a superficial layer of semiconducting material,
  at least one buried layer of a dielectric material between the superficial film and the final substrate,
  and at least one ground plane between said dielectric layer and the substrate.
A diffusion barrier layer may be present between the ground plane and the final substrate.

In all cases, the superficial layer is intact, it has not been passed through by a beam for implanting elements in order to form the ground plane, since it is formed before the assembly step.

Figure 3:
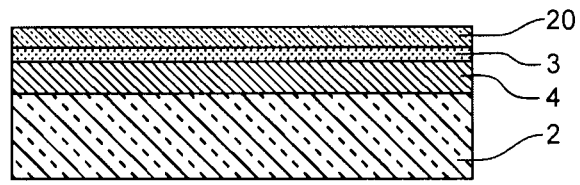
FIGS. 3 and 4 show embodiments of devices according to the invention.
Figure 4:
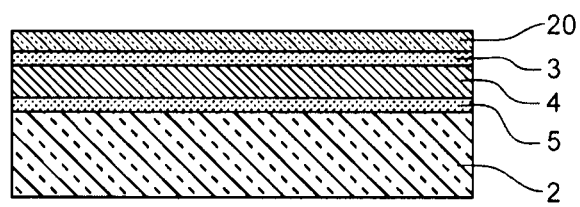
Figure 5A:
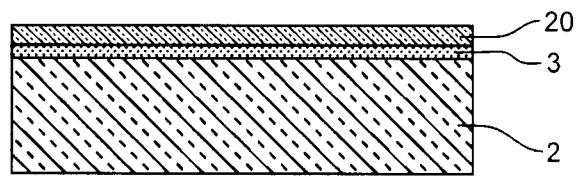
FIGS. 5A and 5B show devices of the SOI type, without and with ground plane.
Figure 5B:
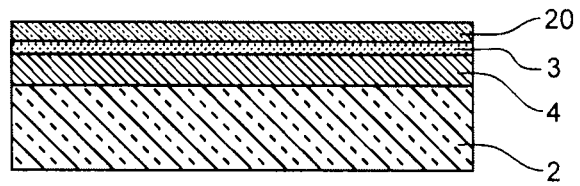

The invention also relates to a semiconducting device with superimposed layers having structures illustrated in one of FIGS. 3 and 4.

Such a device includes a substrate 2.

On this substrate 2 there is a semiconducting layer 4, doped with elements from columns III and V of the Periodic Table, forming a ground plane, the doping in that layer being greater than $10^{18}$ at·cm$^{-3}$, preferably greater than $10^{18}$ at·cm$^{-3}$, and advantageously greater than $10^{21}$ at·cm$^{-3}$.

This device also includes at least one film 20 made from a semiconducting material, as well as a layer of dielectric material 3, the ground plane 4 being between the layer 3 and the final substrate 2, the layer 3 being between the ground plane 4 and the superficial layer 20.

According to one alternative, this device also includes a layer 5 of material forming a diffusion barrier, for example $Si_{99\%}(C)_{1\%}$, which can be situated between the ground plane 4 and substrate 2 (FIG. 4). The thickness of this barrier layer is between 2 nm and 50 nm, e.g. 10 nm.

In a method or device according to the invention:
  the so-called final substrate 2 and the donor substrate 10 can be massive in a semiconducting material, for example silicon or SiC, or composites, and include, on the surface, at least one thin semiconducting layer, e.g. silicon or silicon carbide or SiGe or germanium or GaN . . . . The semiconducting film obtained at the end of the method preferably has a thickness e between 2 nm and 100 nm, and advantageously between 2 nm and 20 nm for applications requiring a superficial film 20 made from a fully depleted (FD) semiconducting material,
  the dielectric layer is, for example, made up of one or several materials chosen among oxides ($SiO_2$ for example), nitrides (SixNy for example), high K materials (such as $HfO_2$, $Al_2O_3$, HfSiON . . . ). The total thickness of this dielectric layer is preferably between 2 nm and 150 nm, and advantageously between 2 nm and 25 nm,
  the ground plane preferably has a thickness between 5 nm and 100 nm, advantageously between 5 nm and 10 nm. Indeed, the thickness of this layer is chosen so as to be fine enough to limit the parasitic capacity phenomena and thick enough to ensure good lateral conduction and limit the diffusion phenomena of the dopant outside said layer.

The semiconducting devices of superimposed layers previously described and the devices obtained using the methods according to the invention can be introduced into any production line. It is thus possible to make microelectronics components on this device such as integrated circuits, and/or MEMS sensors, and/or optical components (MOEMS) and/or bio-components and/or switches. For example, the upper film 20 can thus receive, after the method according to the invention, miscellaneous types of total or localized implantations, so as to dope it and allow the production of electronic components, for example transistors. Given its production method, this film 20 is intact and has not undergone any degradation.

The invention claimed is:
1. A method for making a semiconductor on insulator structure, comprising:
   a) forming, on a surface of a semiconductor substrate, as a final substrate, a semiconducting layer, doped with elements from columns III and V of the Periodic Table so as to form a ground plane;

b) forming a dielectric layer either on a surface made from a semiconducting material of a second substrate, as a source substrate, which is made from a semiconducting material or includes a superficial layer made from a semiconducting material;

or on the final substrate and in contact with the ground plane;

c) then assembling, by direct adhesion of the source substrate, on the final substrate, the layer forming a ground plane between the final substrate and the source substrate, the dielectric layer being between the source substrate and the ground plane; and d) then thinning the source substrate, leaving, on the surface of the semiconductor structure, a film made from a semiconducting material.

2. The method according to claim 1, wherein a layer acting as a barrier against diffusion is deposited on the substrate before making the ground plane.

3. The method according to claim 2, the layer acting as a barrier against diffusion being made from silicon carbide, or of $Si_{99\%}(C)_{1\%}$ type.

4. The method according to claim 1, the dielectric layer being made from oxide and/or nitride and/or high K material.

5. The method according to claim 1, the dielectric layer being formed by reaction and/or by deposition on at least one of the faces to be assembled.

6. The method according to claim 1, the final substrate and/or the source substrate being made from silicon or silicon carbide $Si_{(1-x)}(C)_x$.

7. The method according to claim 1, the ground plane being formed by depositing a doped layer.

8. The method according to claim 7, the doped layer being deposited by epitaxy or CVD or MBE or using another deposition method.

9. The method according to claim 1, the ground plane being formed by ion implantation or plasma doping or CVD doping on the surface of the final substrate.

10. The method according to claim 1, the ground plane being formed by ion implantation through a superficial layer, deposited before implantation and eliminated after implantation.

11. The method according to claim 1, the doping in the ground plane being greater than $10^{19}$ at cm$^{-3}$ or $10^{20}$ at cm$^{-3}$.

12. The method according to claim 1, at least one of the faces to be assembled being nitrided before adhesion.

13. The method according to claim 1, the source substrate having undergone an implantation of gaseous species localized under the surface, to form a buried embrittlement zone there, this operation being able to take place before or after formation of the dielectric layer.

14. The method according to claim 13, the gaseous species implanted in the source substrate being hydrogen.

15. The method according to claim 13, the thinning of the source substrate occurring according to a substrate fracture method at the buried embrittlement zone.

16. The method according to claim 1, the thinning of the substrate occurring by milling, and/or mechanical thinning, and/or mechano-chemical thinning, and/or chemical etching.

* * * * *